United States Patent [19]

Rawson

[11] Patent Number: 5,739,715
[45] Date of Patent: Apr. 14, 1998

[54] DIGITAL SIGNAL DRIVER CIRCUIT HAVING A HIGH SLEW RATE

[75] Inventor: William Peter Rawson, Fort Collins, Colo.

[73] Assignee: Hewlett-Packard Co., Palo Alto, Calif.

[21] Appl. No.: 551,221

[22] Filed: Oct. 31, 1995

[51] Int. Cl.[6] .................. H03K 17/16; H03K 17/04; H03K 19/003
[52] U.S. Cl. .................. 327/387; 327/374; 327/389; 327/108; 326/17
[58] Field of Search .................. 326/17, 27, 87; 327/374, 379, 384, 389, 387, 310, 312, 323, 170, 108, 376, 377, 380, 381, 391, 437

[56] References Cited

U.S. PATENT DOCUMENTS

| | | | |
|---|---|---|---|
| 4,638,187 | 1/1987 | Boler et al. | 326/17 |
| 4,731,553 | 3/1988 | Van Lehn et al. | 326/27 |
| 4,779,013 | 10/1988 | Tanaka | 327/391 |
| 4,829,199 | 5/1989 | Prater | 326/87 |
| 4,890,016 | 12/1989 | Tanaka et al. | 326/87 |
| 5,122,690 | 6/1992 | Bianchi | 326/87 |
| 5,166,555 | 11/1992 | Kano | 326/87 |
| 5,192,879 | 3/1993 | Aoki et al. | 326/87 |
| 5,293,082 | 3/1994 | Bathaee | 327/170 |

FOREIGN PATENT DOCUMENTS

| | | | |
|---|---|---|---|
| 62-292015 | 6/1986 | Japan | 326/87 |
| 63-245119 | 3/1987 | Japan | 327/374 |
| 389624 | 8/1989 | Japan | 326/27 |
| 3242020 | 2/1990 | Japan | 327/389 |
| 5327443 | 5/1992 | Japan | 327/389 |

Primary Examiner—Timothy P. Callahan
Assistant Examiner—Terry L. Englund

[57] ABSTRACT

A driver circuit for driving multiple lines with unknown loads uses a high slew rate driver to drive the output during input signal transitions, and uses a termination driver to drive the output during input signal steady state conditions. The high slew rate driver provides rapid transitions, and the terminating driver provides ideal output impedance to maintain the fidelity of the output signal.

2 Claims, 6 Drawing Sheets

5,739,715

1

DIGITAL SIGNAL DRIVER CIRCUIT HAVING A HIGH SLEW RATE

FIELD OF THE INVENTION

This invention relates to the use of drivers used in circuits to drive a signal to a number of loads.

BACKGROUND OF THE INVENTION

Computers often contain printed circuit boards that contain large numbers of integrated circuit chips. These boards have a variety of uses. Typically, a computer contains at least one board that is used to hold memory chips. Memory chips are an expensive commodity, so the boards are sometimes sold with a large number of sockets for the chips but with only a few memory chips in place. The computer owner has the option to purchase additional memory chips and add them to the board, thus increasing the amount of memory the computer has available. This is a common example that leads to problems for board designers.

The designer for a memory board is attempting to take a particular signal and pass it to the memory chips in place. The designer does not know whether only a few, or some or all the memory chips will be in place when the board is functioning because the future owner of the memory board may choose to add or remove memory chips at any time.

The variation in number of chips in place on the memory board affects the electrical characteristics of the signal being passed to the chips. The designer must find a way to take these variations into account in the design of the memory board, or the board may not perform correctly. The signal passed to the memory chips may be degraded and add errors to the signal or may slow the speed of the signal transfer. This problem is the same whether considering memory chips placed into sockets, or single in-line memory modules (SIMMs) placed into SIMM sockets on a board. This is an example of one type of problem that is solved by the present invention.

FIG. 1 is a timing diagram that shows a comparison between an ideal data stream and data streams of varying fidelity. Data streams 101, 102, 103 and 104 are shown representing identical data. Data stream 101 shows the ideal data stream. Data is broken down into single digital bits which are sometimes referred to as ones and zeros. The state of each bit is determined at a particular point in time, and is usually determined at regular intervals for a series of bits. The state is either zero or one, or in transition from one state to the other. For example, the state at point 105 is one, at point 106 is zero and at point 107 is in transition. All transitions are instantaneous for this ideal representation.

Although the data is ideally in digital form, in reality the digital information is conveyed by an analog signal that is used to represent the ideal data. The analog signal is implemented by devices with physical limitations, and therefore is not identical to the ideal data stream. Data streams 102, 103 and 104 show a representation of the same data stream after it is affected by the physical limitations of the devices used to implement the analog signal.

In a more realistic representation, the ideal states of one and zero are represented by voltages within a range of voltages. The logical one is defined to be a voltage $V_H$ that is high relative to the range of voltages. The logical zero is defined to be a voltage $V_L$ that is low relative to the range of voltages. Transitions between the logical states are voltage shifts between $V_L$ and $V_H$. These voltage shifts do not occur instantaneously, but instead take a period of time that is dependent on the physical conditions present in the circuit.

2

Data stream 102 shows a data stream with good fidelity. Data stream 103 shows a data stream with moderate fidelity. Data stream 104 shows a data stream with poor fidelity. Data stream 104 shows incorrect data because of signal degradation at times $t_1$, $t_2$ and $t_4$.

FIG. 2 is a schematic for a prior art driver that does not correct for fidelity problems and therefore could lead to a result similar to the data stream 104.

Element 201 is a p-channel field-effect-transistor (FET). Element 202 is an n-channel FET. Element 203 is an invertor. The input flows through invertor 203. In the case of the input moving from a low state $V_L$ to a high state $V_H$, the output of invertor 203 moves from a high state $V_H$ to a low state $V_L$. This turns off FET 202 and turns on FET 201 at the time the voltage passes through the threshold voltage $V_T$, thus driving the output high. When the input is moving from a high state $V_H$ to a low state $V_L$, the output of invertor 203 moves from a low state $V_L$ to a high state $V_H$. This turns off FET 201 and turns on FET 202 at the time the input passes through the threshold voltage $V_T$, thus driving the output low.

In this example, $V_{DD}$ is set at 5 volts. For some newer applications, $V_{DD}$ could be set at 3.3 volts. The value of $V_{DD}$ is usually chosen to operate with a family of parts that use a similar voltage. $V_H$ would be approximately $V_{DD}$ or within 600 millivolts of $V_{DD}$, and $V_L$ would be approximately zero volts, or within 600 millivolts of zero. The threshold voltage $V_T$ would be $V_{DD}/2$, or approximately 2.5 volts for this example.

The normal implementation for this is CMOS, but it could also be implemented with other processes, for example, bipolar processes. The implementation may require other devices not shown in FIG. 2.

The problem for the circuit of FIG. 2 occurs when the signal is driven to a poorly terminated load. A poorly terminated load occurs when the load impedance does not match the output impedance of the driver circuit. The mismatch in impedance leads to reflections from the load that are passed back to the driver circuit. This driver circuit would then re-reflect the reflection causing signal degradation and poor fidelity.

One attempt at improvement over the schematic of FIG. 2 is shown in FIG. 3. The behavior of the circuit is identical to the circuit of FIG. 2, except resistor 304 has been added. Resistor 304 is used to attempt to match the output impedance of the driver circuit to the transmission line, since the load impedance is unknown. Unfortunately, the value chosen by the circuit designer for the resistor 304 leads to a trade-off between speed and fidelity. A common value for resistor 304 is between 25 and 30 ohms. If the value of the resistance is larger, the fidelity of the output signal improves, but the speed of the transitions between states is decreased and eventually the circuit is too slow to be practical. If the value of the resistance is smaller, the speed of the transitions between states is increased, but fidelity is diminished and eventually may be unacceptable.

SUMMARY OF THE INVENTION

The present invention uses a high slew rate driver to drive the output during input signal transitions, and uses a termination driver to drive the output during input signal steady state conditions. A high slew rate driver controller is used to control the high slew rate driver by receiving the input signal and feedback from the output to determine when the output has finished the transition. The high slew rate driver provides rapid transitions, and the terminating driver provides ideal output impedance to maintain the fidelity of the output signal.

DESCRIPTION OF THE PREFERRED EMBODIMENT

Figure 1:
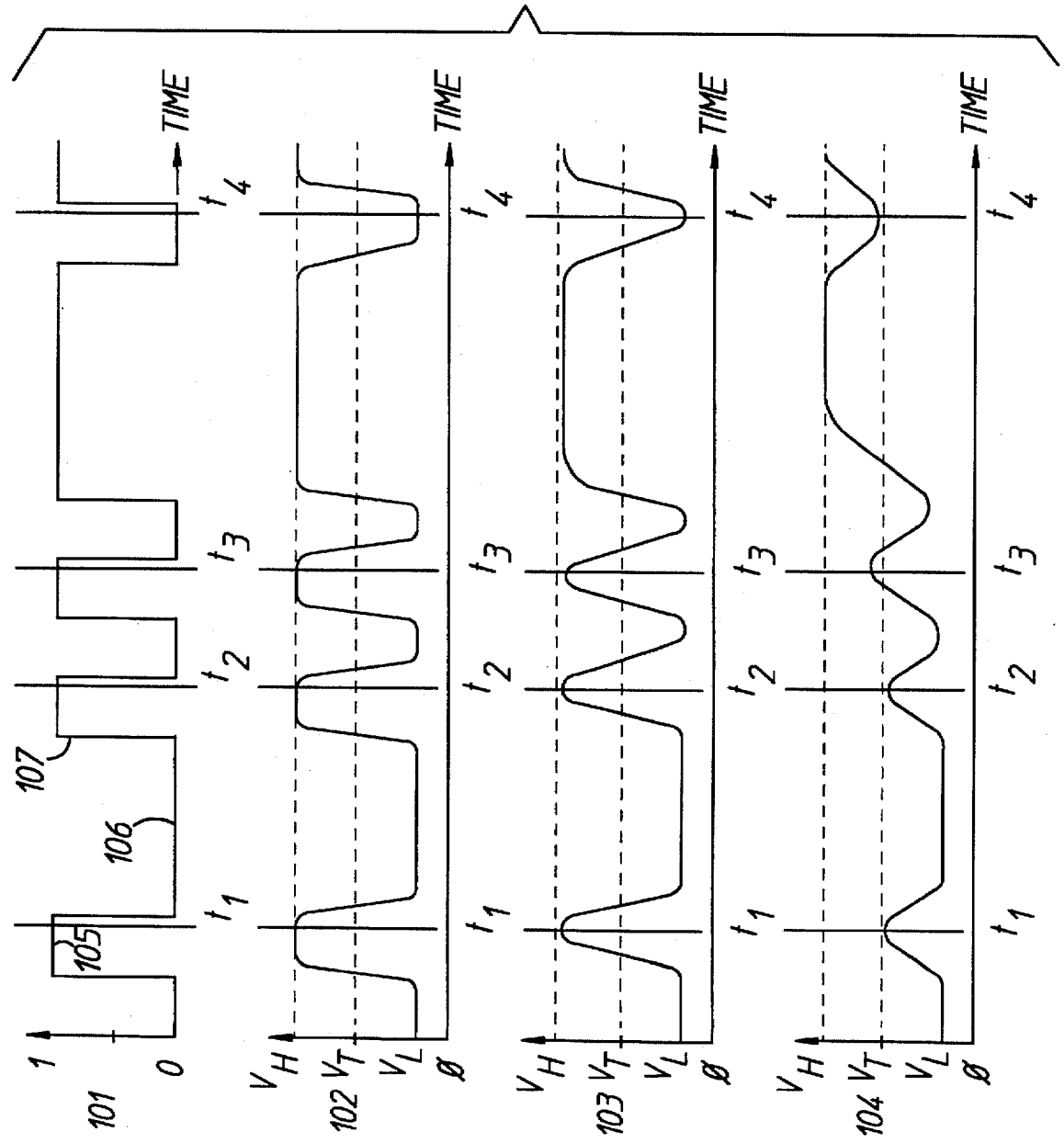
FIG. 1 is a timing diagram that shows a comparison between an ideal data stream and data streams of varying fidelity.
Figure 2:
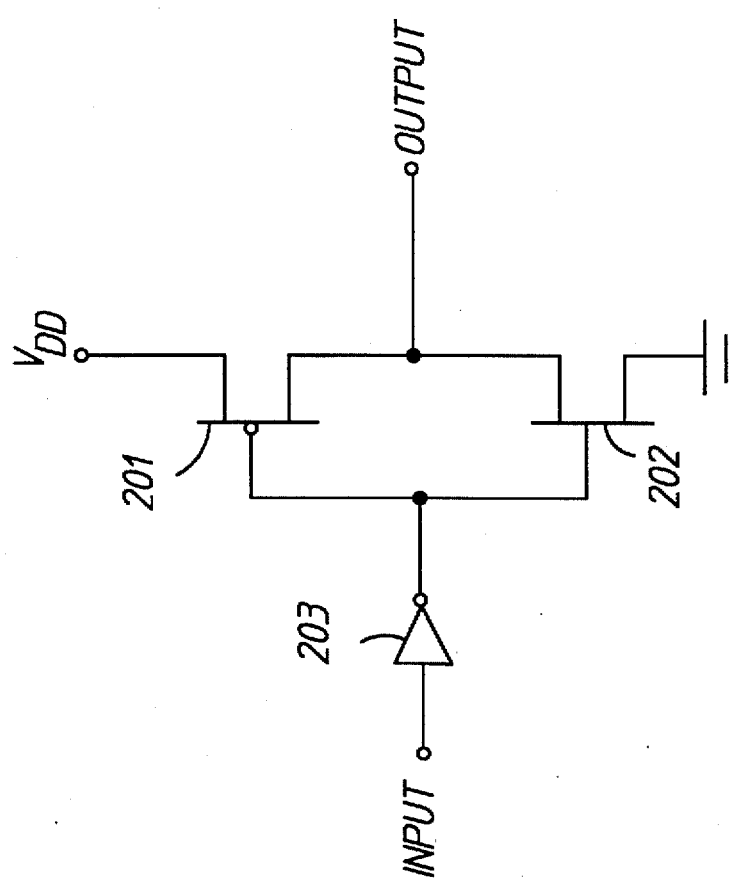
FIG. 2 is a schematic for a prior art driver that does not correct for fidelity problems.
Figure 3:
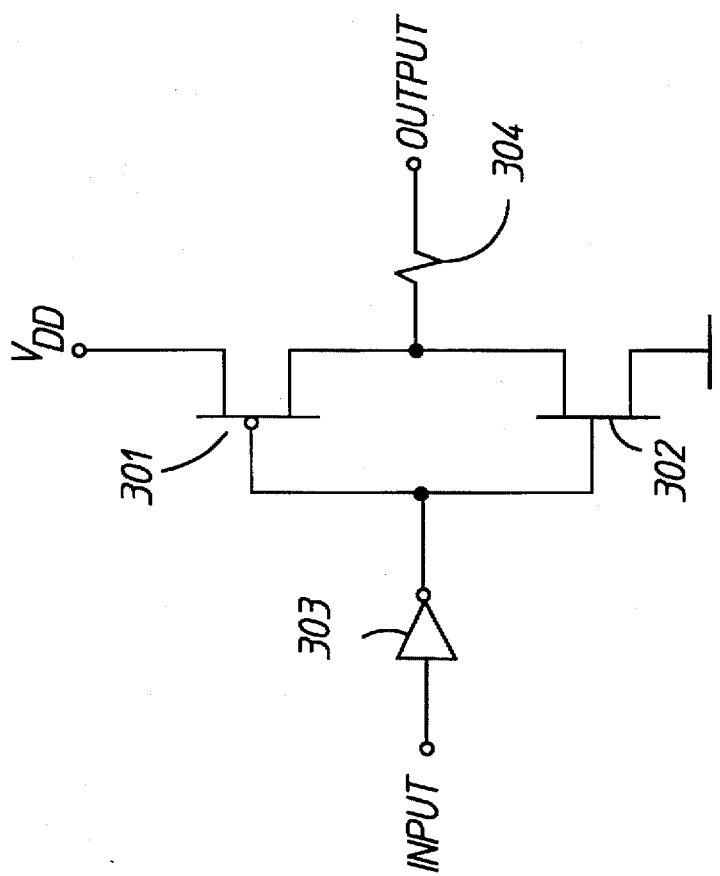
FIG. 3 is a schematic for a prior art driver that uses a resistor to attempt to match the impedance of the circuit.
Figure 4:
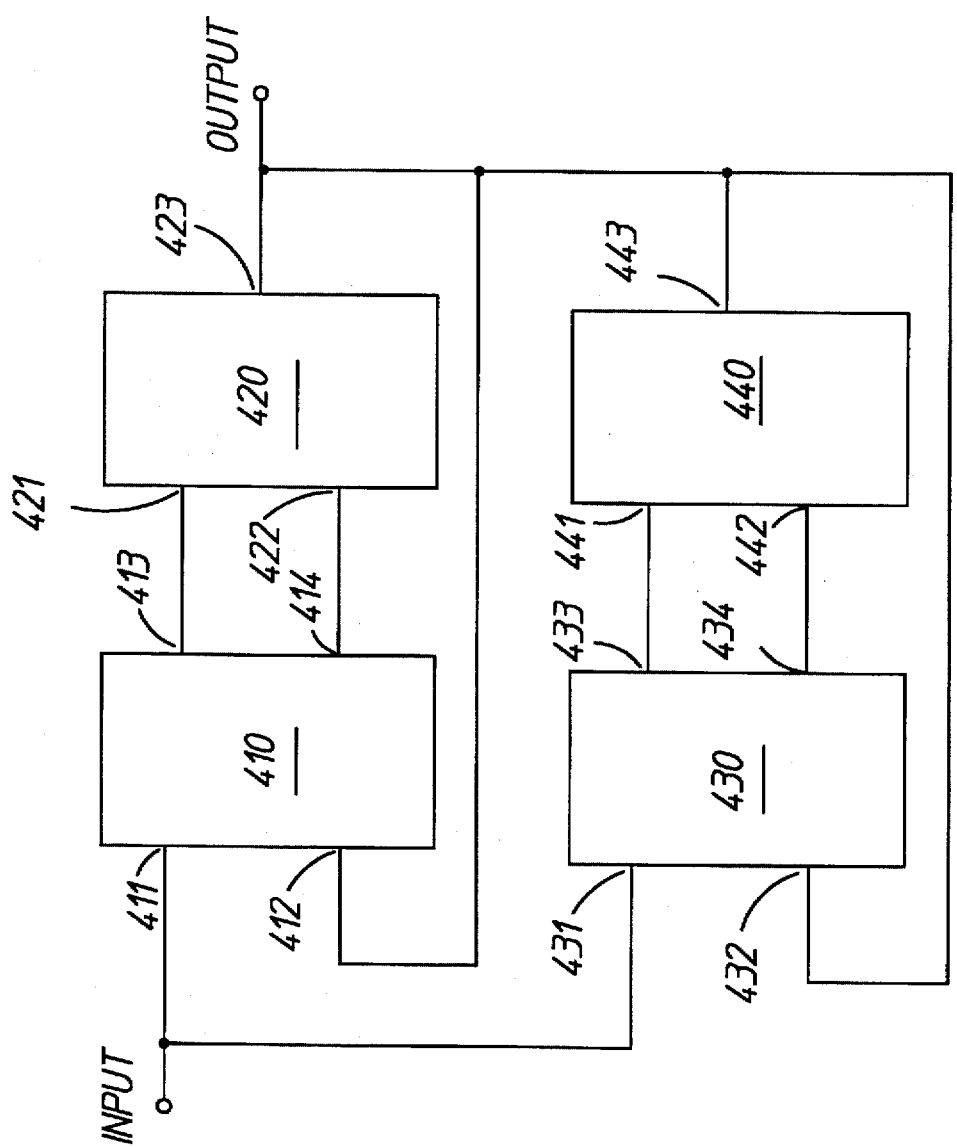
FIG. 4 is a block diagram of one embodiment of the present invention that shows a high slew rate driver and its controller, and a terminating driver and its controller.

FIG. 4 shows a high slew rate driver 440 with input 441, input 442 and output 443 that corresponds to the combination of driver 201 and driver 202 in FIG. 2. The high slew rate driver 440 is controlled by the high slew rate driver controller 430 with input 431, input 432, output 433 and output 434. Output 433 is connected to input 441. Output 434 is connected to input 442. Output 443 is connected to input 432. The circuit input is connected to input 431.

FIG. 4 also shows a terminating driver 420 with input 421, input 422 and output 423. The terminating driver 420 is controlled by the terminating driver controller 410 with input 411, input 412, output 413 and output 414. Output 413 is connected to input 421. Output 414 is connected to input 422. Output 423 is connected to input 412. The circuit input is connected to input 411.

The high slew rate driver 440 is a strong driver that is used during transition from high to low or from low to high. Because of its power, it enables transitions to occur quickly and with high fidelity. The drawback to the high slew rate driver is that its output impedance is very low. When reflections occur from the load mismatch, the output impedance of the high slew rate driver causes a re-reflection back towards the load. This leads to signal degradation and loss of fidelity.

The terminating driver 420 does not have the output impedance problem of the high slew rate driver 440. It will absorb reflections from the load, and therefore offers improved signal fidelity. However, it does not have the strength of the high slew rate driver 440 and is therefor slow if used to implement a transition.

The purpose of the high slew rate controller 430 is to turn on the high slew rate driver when a transition occurs on the circuit input. Controller 430 then senses the completion of the transition at output 443 and turns off driver 440.

The purpose of the termination driver controller 410 is to turn off the terminating driver 420 when a transition occurs on the circuit input. During transition, the high slew rate driver 440 drives the signal until the transition is completed. Controller 410 senses the completion of the transition on output 423 and turns terminating driver 420 on. The result is that the high slew rate driver 440 is driving the output only during transition, and the terminating driver 420 is driving the output while the input signal is in a steady state. In general, the data stream is usually in a steady state, and the use of the high slew rate driver 440 ensures that the transitions are relatively short compared to the steady state. Consequently, when reflections occur because of termination problems at the load, the reflections are absorbed by the terminating driver 420. The high slew rate driver 440 is switched off and appears as an open circuit (infinite resistance). It does not cause the re-reflection that it otherwise would have but for the presence of the terminating driver 420.

Figure 5:
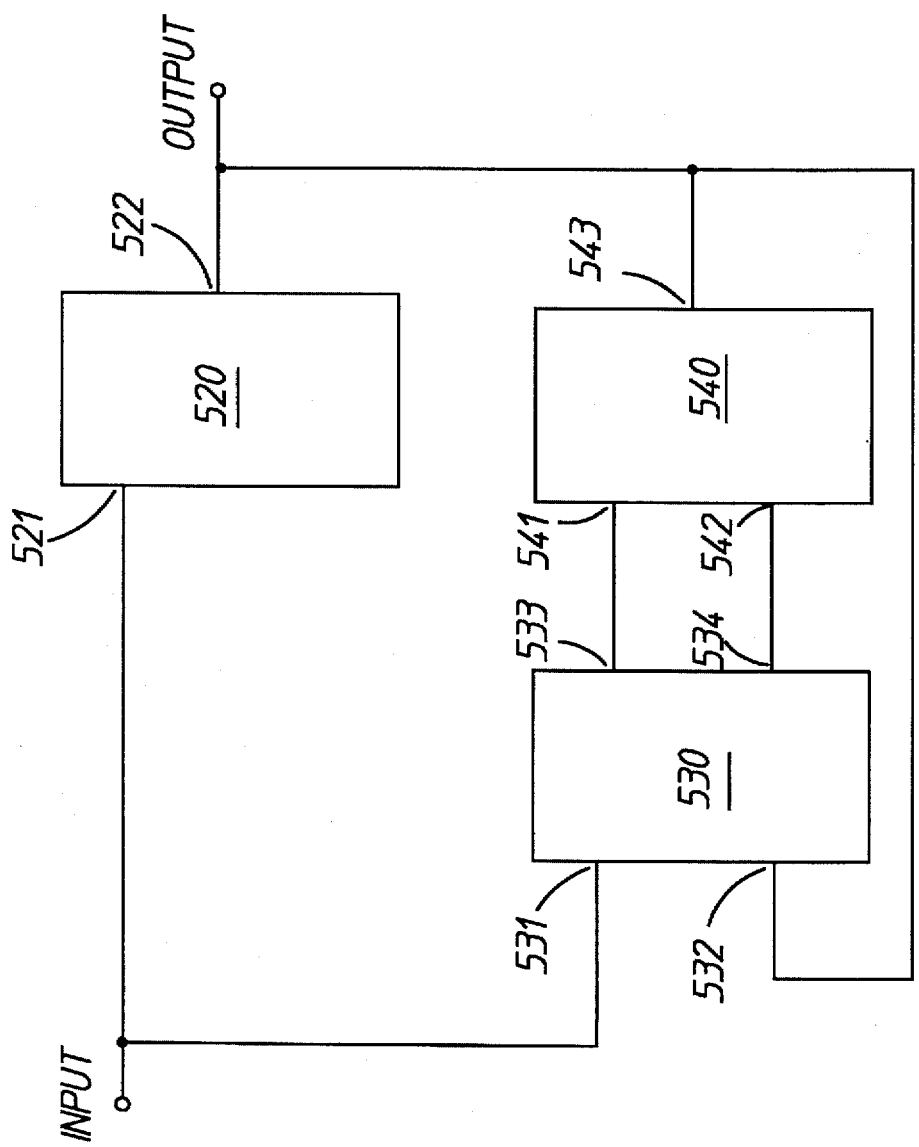
FIG. 5 is a reduced version of the block diagram of FIG. 4 that shows a high slew rate driver and its controller and a terminating driver.

In FIG. 5, the general invention of FIG. 4 is simplified because of the realization that the terminating driver 520 does not hinder the high slew rate driver 540 but rather assists driver 540 in pushing the signal through transitions. Consequently, no controller is needed for the terminating driver 520.

High slew rate driver controller 530 functions in the same manner as controller 430 in FIG. 4. High slew rate driver 540 functions in the same manner as high slew rate driver 440 in FIG. 4.

Figure 6:
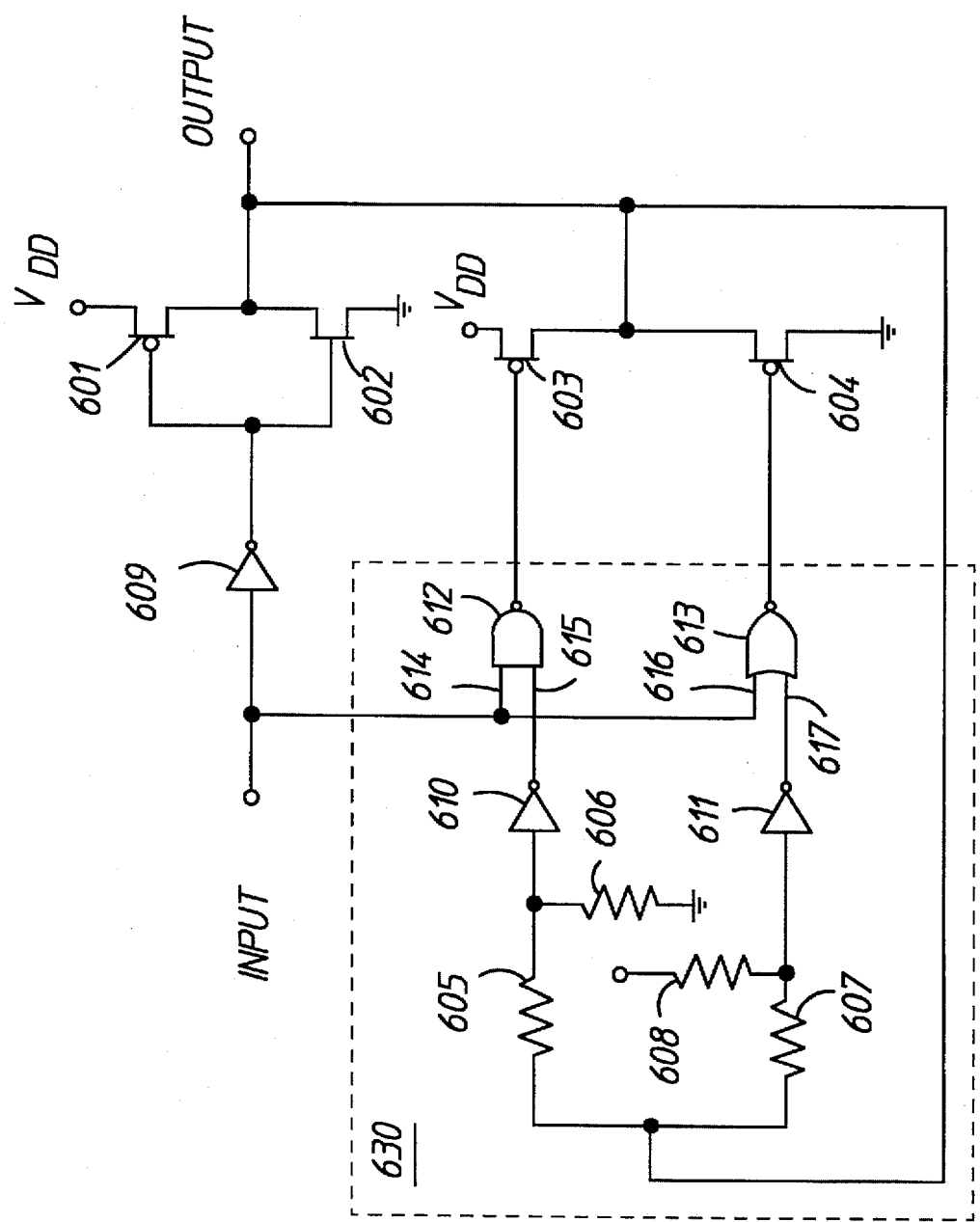
FIG. 6 is a schematic diagram of one embodiment of the present invention.

FIG. 6 is a schematic diagram of the present invention. FIG. 6 corresponds to the block diagram of FIG. 5. Invertor 609 inverts the input for use by the terminating driver. Element 601 is a p-channel FET that is the terminating driver for the high state. Element 602 is an n-channel FET that is the terminating driver for the low state. The combination of invertor 609, driver 601 and driver 602 corresponds to block 520 in FIG. 5.

Element 603 is a p-channel FET that is the high slew rate driver for the transition from low state to high state. Element 604 is an n-channel FET that is the high slew rate driver for the transition from high state to low state. The combination of driver 603 and driver 604 corresponds to block 540 in FIG. 5.

Block 630 corresponds to block 530 in FIG. 5. The two input NAND gate 612 operates as a switch for driver 603. As the circuit input transitions from low to high, the NAND gate 612 output shifts from high to low, thereby activating high slew rate driver 603. Driver 603 is active during the input transition from low to high. As the circuit output also transitions from low to high in response to the input signal, the output is fed back to the combination of resistor 605 and resistor 606 that functions as a voltage comparator. As the output approaches $V_H$, the output of invertor 610 shifts from high to low, thereby switching off NAND gate 612 and shutting off driver 603. The circuit output continues to be held high by the terminating driver 601.

The two input NOR gate 613 operates as a switch for driver 604. As the circuit input transitions from high to low, the NOR gate 613 output shifts from low to high, thereby activating high slew rate driver 604. Driver 604 is active during the input transition from high to low. As the circuit output also transitions from high to low in response to the input signal, the output is fed back to the combination of resistor 607 and resistor 608 that functions as a voltage comparator. As the output approaches $V_L$, the output of invertor 611 shifts from low to high, thereby switching off NOR gate 613 and shutting off driver 604. The circuit output continues to be held low by the terminating driver 602.

In one embodiment, the values of resistor 605 is 30 kiloohms, resistor 606 is 50 kiloohms, resistor 607 is 30 kiloohms and resistor 608 is 50 kiloohms. $V_{DD}$ is at 5 volts.

I claim:

1. A driver circuit having a circuit input and a circuit output for driving a digital input signal to an unknown load comprising:

a high slew rate driver connected to the circuit output for driving an output signal based on the input signal during input signal transitions between states, a high slew rate driver controller connected to the circuit input at a first input, the high slew rate driver and the circuit output for controlling the high slew rate driver, a delay circuit having an input connected to the circuit output and having an output connected to a second input of said high slew rate driver controller, wherein a delayed voltage from the circuit output is applied to the second input to cut off the high slew rate driver, the delay circuit comprising a voltage divider circuit and an inverter circuit, wherein an input of the voltage divider circuit is connected to the circuit output, an output of the voltage divider is connected to an input of the inverter circuit, and an output of the inverter circuit is connected to the second input of the high slew rate driver controller, and a termination driver connected to the circuit input and the circuit output for driving the output signal based on the input signal.

2. A driver circuit based on claim 1 wherein the high slew rate driver controller further comprises:

a high transition driver controller for controlling the high slew rate driver during input signal transitions from low state to high state, and a low transition driver controller for controlling the high slew rate driver during input signal transitions from high state to low state.

* * * * *